United States Patent
Fujimori et al.

[11] Patent Number: 6,105,782
[45] Date of Patent: Aug. 22, 2000

[54] STORAGE CONTAINER FOR PRECISION SUBSTRATES

[75] Inventors: Yoshiaki Fujimori, Itoigawa; Masato Takahashi, Joetsu; Toshiyuki Kamada, Omiya, all of Japan

[73] Assignee: Shin-Etsu Polymers Co., Ltd., Tokyo, Japan

[21] Appl. No.: 09/372,461

[22] Filed: Aug. 11, 1999

[30] Foreign Application Priority Data

Aug. 17, 1998 [JP] Japan .................................. 10-230993

[51] Int. Cl.[7] ................................................ B65D 85/48
[52] U.S. Cl. ........................................... 206/710; 206/1.5
[58] Field of Search ............................ 206/1.5, 710, 711, 206/454; 118/500; 414/217, 219, 292

[56] References Cited

U.S. PATENT DOCUMENTS 5,628,683  5/1997  Gentischer .
5,711,427  1/1998  Nyseth ..................... 206/710
5,788,082  8/1998  Nyseth ..................... 206/711

FOREIGN PATENT DOCUMENTS 9 88398      9/1992   Japan .
8-340043    12/1996   Japan .
WO/90/14273 11/1990   WIPO .

*Primary Examiner*—Jacob K. Ackun
*Attorney, Agent, or Firm*—Darby & Darby

[57] ABSTRACT

A storage container for multiple wafers in alignment in its pod, includes: a hollow door element which opens and hermetically closes the open front of the pod; and a guide arrangement for guiding and positioning the door element into the open front when the door element is closed. This guide arrangement is configured of a first inclined guide portion, at least, formed in the underpart of the opening of the pod, gradually going outwards toward the distal end; and a second inclined guide portion, at least, formed in the underpart of the periphery of the door element, gradually going outwards from the inner side to the outer side and coming in contact with the first inclined guide portion when the door element is closed.

7 Claims, 15 Drawing Sheets

STORAGE CONTAINER FOR PRECISION SUBSTRATES

BACKGROUND OF THE INVENTION (1) Field of the Invention

The present invention relates to a storage container for precision substrates which is used for storage, preservation, in-process work, transportation of precision substrates such as aluminum discs, semiconductor wafers, mask glass substrates, etc., and more specifically relates to improvement of the container body, door and locking mechanism of a storage container for precision substrates which can be connected to a system having a standardized mechanical interface used in the semiconductor wafer fabrication process.

(2) Description of the Prior Art

A conventional storage container for precision substrates, though it is not illustrated, includes: a pod for accommodating multiple semiconductor wafers (to be referred to merely as wafers) etc., in alignment; a hollow door element for hermetically closing the open front of the pod; and a locking means for keeping the closed state when the door has been closed.

The locking means is categorized into two types, the inner lock type and the outer lock type. An inner lock type locking means is configured of multiple clamp bores formed in a depressed manner on the upper and lower inner peripheral surfaces of the open front of the pod, multiple passage openings pierced, correspondingly to the multiple clamp bores, on the upper and lower peripheral surface of the door element, a rotary cam which is axially supported in the center inside the door element and is rotated from an external access, and a pair of latch plates disposed above and below and each having a guide groove to be engaged with some play with a corresponding coupling pin on the rotary cam surface at the periphery thereof. Each latch plate is made of metal so that it can provide high rigidity and has an engagement claw disposed in the distal end to be projected through the passage opening for engagement with the corresponding clamp bore.

Compared to this, an outer lock type locking means is configured of multiple engaging pieces pivotally formed in the outer peripheral portion of the open front of the pod and multiple projections formed on the peripheral surface of the door element. These multiple engaging pieces and projections function so as to engage each other when the door element is closed.

In the above configuration, when wafers need to be stored, preserved, transported, multiple wafers are loaded one by one into the pod first and then the door element is fitted hermetically to the open front of the pod. Thereafter, the door opening/closing device of an unillustrated processing machine rotates the rotary cam in one locking direction so that each latch plate moves linearly and projects outwardly from the inner position inside the door element and hence engagement claws become engaged with the clamp bores to maintain the locked state of the door element.

When the wafers which have been stored, preserved, transported etc., need to be processed, the door opening/closing device of the processing machine rotates the rotary cam in the other direction to unlock, so that each latch plate moves linearly and returns inwardly from the outer position inside the door element and hence engagement claws become disengaged from the clamp bores thus permitting the door element to be released. When the door element thus becomes openable, the door element is removed from the pod by vacuum suctioning or other ways. Then the wafers are taken out one by one from the lowermost one so that the wafers will be processed in the predetermined manner.

Prior art disclosures related to the technique of this kind are also found in Japanese Patent Application Laid Open Hei 9 No.88398 and Hei 8 No.340043, Japanese Patent Application Disclosure Hei 4 No.505234 and Hei 7 No.504536.

Thus, the conventional storage containers for precision substrates have been thus configured so that the door element may be merely fitted in the open front of the pod and may be merely taken off, without taking into consideration the looseness of the door element due to repeated usage. Further, no consideration has been given for the displacement of the door element from the pod due to errors of repeatability etc. of the operation of the processing machine for retaining the door element when the door element is taken out. If the door element works loose or is fitted out of position, each clamp bore, passage opening and engagement claw are positioned out of line when the door element is fitted, making it difficult to lock the door element or causing abrasion between the pod's open front and the door element's edge which will produce contaminants such as floating particles etc.

In recent years, in order to realize a higher packing density configuration, a finer structure and an improved production efficiency of semiconductor integrated circuits, an agreement on the standardization of large-sized wafers (of 300 mm in diameter) has been reached and intensive research and development have been in progress. However, for example, if the pod is simply made greater in order to store 300 mm wafers, the problems as follows will occur. First, if the pod is made greater, there is a risk that the latch plates may warp during locking and hence the fully open front of the pod cannot be uniformly sealed in a well enough manner. Further, conventionally, the latch plates have been made of metals, however, this has been the hindrance to rinsing of the door element, giving rise to a serious problem of the wafers being contaminated.

SUMMARY OF THE INVENTION

The present invention has been devised in view of the above problems and it is therefore an object of the present invention to provide a storage container for precision substrates which is free from looseness of the door element when the door which has been removed from the container opening is attached again to the container opening and can simplify the door locking mechanism and prevent contaminant generation. It is also another object of the invention, to provide a storage container for precision substrates which can correctly seal the opening of the container body and prevent precision substrates from being contaminated even for a large-sized container.

In order to achieve the above object, the present invention is configured as follows:

In accordance with the first aspect of the present invention, a storage container for precision substrates includes: a container body having an opening formed on one end face and storing precision substrates therein; a door element which can open and close the opening in a hermetic manner; and guide means for guiding and positioning the door element with respect to the opening of the container body when the door element is closed.

In accordance with the second aspect of the present invention, the storage container for precision substrates having the above first feature is characterized in that the guide means comprises: a first inclined guide portion, at least, formed in the underpart of the opening, gradually going outwards toward the distal end; and a second inclined guide portion, at least, formed in the underpart of the periphery of the door element, gradually going outwards from the inner side to the outer side of the door element, the second inclined guide portion being put in contact with the first inclined guide portion when the door element is closed.

In accordance with the third aspect of the present invention, the storage container for precision substrates having the above first feature is characterized in that the guide means comprises: a depressed mating portion, at least, formed on either the underpart of the opening or the underpart of the door element periphery; and a mating projection, at least formed on the remaining underpart of either the opening or the door element periphery so as to mate with the depressed mating portion when the door element is closed, and the contact surface between the depressed mating portion and the mating projection is inclined as going outwards, from its proximal point closer to the opposed face toward the open face.

In accordance with the fourth aspect of the present invention, the storage container for precision substrates having the above first feature is characterized in that the guide means comprises: a first inclined guide portion, at least, formed in the underpart of the opening, gradually going outwards toward the distal end; a second inclined guide portion, at least, formed in the underpart of the periphery of the door element, gradually going outwards from the inner side to the outer side of the door element, the second inclined guide portion being put in contact with the first inclined guide portion when the door element is closed; and an antifriction element which is resiliently supported by either the first inclined guide portion or the second inclined guide portion and is pressing contact with the other of the first inclined guide portion or the second inclined guide portion, when the door element is closed.

In accordance with the fifth aspect of the present invention, 5. The storage container for precision substrates having the above first feature is characterized in that the guide means comprises: one or multiple guide portions formed on the outer surfaces of the periphery of the opening; and one or multiple plate-like projection pieces formed on the outer peripheral surface of the door element.

In accordance with the sixth aspect of the present invention, a storage container for precision substrates includes: a container body having an opening formed on one end face and storing precision substrates therein; a door element which is substantially hollow and can open and close one open face in a hermetic manner; and a locking means for fixing the door element in a closed state, wherein the locking means comprises: a clamp bore formed on the inner peripheral surface of the open face of the container body; a passage opening provided in the peripheral surface of the door element; a rotary element which is incorporated in the door element and rotated from an external access; an actuation transmitting element which is actuated by the rotation of the rotary element to advance outwards and retract inwards within the door element; and a clamp element which projects out through the passage opening and fits into the clamp bore when the actuation transmitting element advances and returns inside the passage opening when the actuation transmitting element retracts.

In accordance with the seventh aspect of the present invention, the storage container for precision substrates having the above sixth feature, further includes: a coupling projection provided on the rotary element to couple the rotary element with the actuation transmitting element so as to cause the actuation transmitting element to make a linear movement when the rotary element rotates; a guide means provided inside the door element for guiding the actuation transmitting element; and one or plurality of rotatable antifriction elements attached to the contact areas between the actuation transmitting element and the coupling projection and/or the contact areas between the actuation transmitting element and the guide means.

In accordance with the eighth aspect of the present invention, the storage container for precision substrates having the above sixth feature is characterized in that the clamp element comprises: a first arm attached rotatably to the distal end of the actuation transmitting element; and a second arm, of a bent shape, attached to the distal end of the first arm, and the distal end of the second arm forms an insert-fastening fitting into the clamp bore while the proximal end of the second arm is supported at a point in proximity to the passage opening inside the door element, so that the second arm can rotate inwards and outwards with respect to the door element.

In accordance with the ninth aspect of the present invention, the storage container for precision substrates having the above sixth feature is characterized in that, in the locking means, at least the clamp element, the actuation transmitting element and the rotary element are formed of PEEK (polyetheretherketone) resin.

In accordance with the tenth aspect of the present invention, the storage container for precision substrates having the above seventh feature is characterized in that the antifriction element is formed of PEEK resin.

In the above configurations, the first feature corresponds to the first principal invention and the second through fourth features correspond to its dependent inventions. The sixth feature corresponds to the second principal invention and the seventh through tenth features correspond to its dependent inventions. The descriptions of the first and second main inventions, hereinbelow, will include their dependent inventions as the embodiments.

The container and door element of the above invention can be formed as a molding of resin such as polycarbonate (PC), acrylic resin, polybutylene terephthalate (PBT), PEEK (polyetheretherketone), PEI (polyetherimide), PES (polyethersulfone), polypropyrene (PP), etc. Also, it is possible to perform antistatic finish and/or coloring, as required. When used as a 300 mm wafer carrier, the external appearance of the container body can be configured to substantially conform to SEMI standards E47.1-0097 and the modified ballot. Examples of the precision substrates include one or a multiple number (for example, 13 pieces or 25 pieces) of aluminum discs, liquid crystal cells, quartz glass, semiconductor wafers (silicon wafers etc.) and mask substrate, etc., used in manufacturing fields for information communications, electric engineering, electronics and semiconductor engineering etc. When the precision substrates are semiconductor wafers, large-sized (for example, 200 mm to 300 mm or more) semiconductor wafers are included.

The first inclined guide portion is sufficiently provided if it is formed at least in the underpart of the opening of the container body, and it may also be formed in the upper part, one side part and/or the other side part of the opening of the container body. The second inclined guide portion is sufficiently provided if it is formed at least in the underpart of the door element, and it may also be formed in the upper part, one side part and/or the other side part of the door element.

The rotational elements, actuation transmitting elements, clamp elements and/or antifriction elements as the components of the locking means can be formed of resin material providing beneficial sliding performance and having a high enough strength. Examples include poly-acetal resin, PEEK, polycarbonate, PPS (polyphenylenesulfide), polybutylene terephthalate, PEI, or fluororesin, etc. It is also possible to use various kinds of resins which are modified as to slidability by combination of fluororesin. Further, it is possible to add fillers such as glass fibers, glass beads, talc, etc., to the above resin in order to enhance the mechanical strength. Further, it is also possible to mold the above resin with metal inserts.

In accordance with the first feature of the invention, when the door element is fitted hermetically to the opening of the container body, the door element can be guided by the guiding means provided for the container body and door element, hence the door element can be placed forming a sealed state while it is precisely positioned horizontally and vertically.

In accordance with the fourth feature of the invention, when the door element is fitted into a sealed state whilst the second inclined guide portion of the door element is guided by the first inclined guide portion of the container body, the antifriction elements in contact with the first or second inclined guide portion are pressed down and plunged into the door element or container body.

In accordance with the sixth feature of the invention, when the locking means for the door element covering the opening of the container body is locked, the rotary element rotates in one direction so that the actuation transmitting element advances outwardly from the inner position inside the door element to thereby move the clamp element. The clamp element rotates outwardly from the inner position of the door element to pass through the passage opening and engage itself with the clamp bore to maintain the fixed state of the door element.

In accordance with the seventh feature of the invention, rotatable antifriction elements are arranged at the contact areas between the actuation transmitting element and coupling projections, and/or at contact areas between the actuation transmitting element and guide elements to reduce abrasion. Thus, it is possible to reduce or prevent particle generation when the container body and door element are put in contact.

In accordance with the eighth feature of the invention, when the locking means is locked, the rotary element rotates in one direction so that the actuation transmitting element advances outwardly from the inner position inside the door element to thereby move the first arm of the clamp element. The second arm of the clamp element rotates outwardly from the inner position of the door element so as to cause the insert-fastening to project out through the passage opening and engage with the clamp bore to maintain the fixed state of the door element. During this, the insert-fastening of the second arm is engaged with the clamp bore in approximate alignment with the actuation transmitting element. Therefore, external force acting on the rotary element can be transmitted successfully to the clamp element.

DESCRIPTION OF THE PREFERRED EMBODIMENTS

The embodiments of the first principal invention will hereinafter be described with reference to the accompanying drawings. The first principal invention, however, will not be limited by the embodiments hereinbelow.

Figure 1:
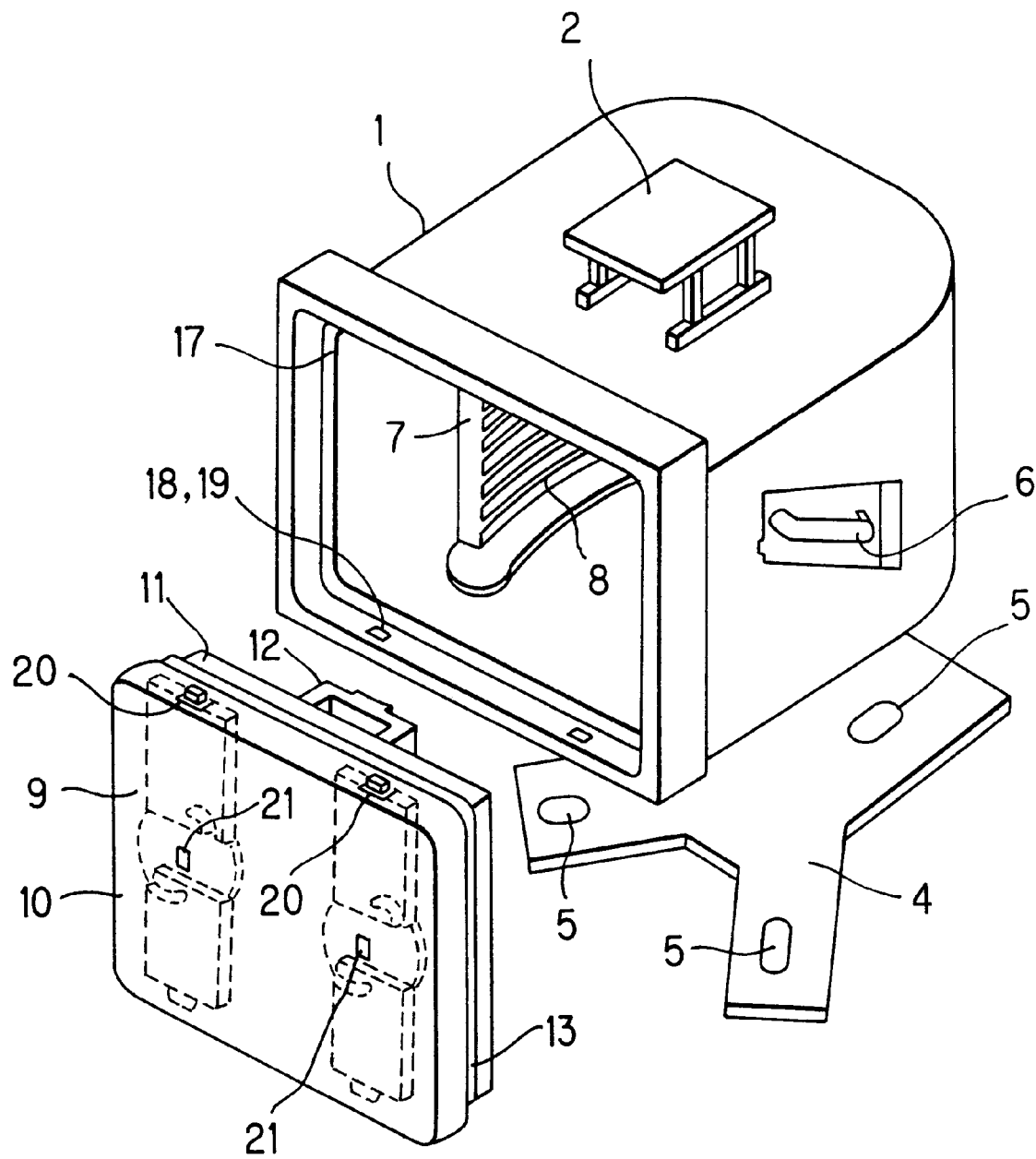
FIG. 1 is a perspective illustrative view showing the embodiment of a storage container for precision substrates in accordance with the first principal invention.
Figure 2:
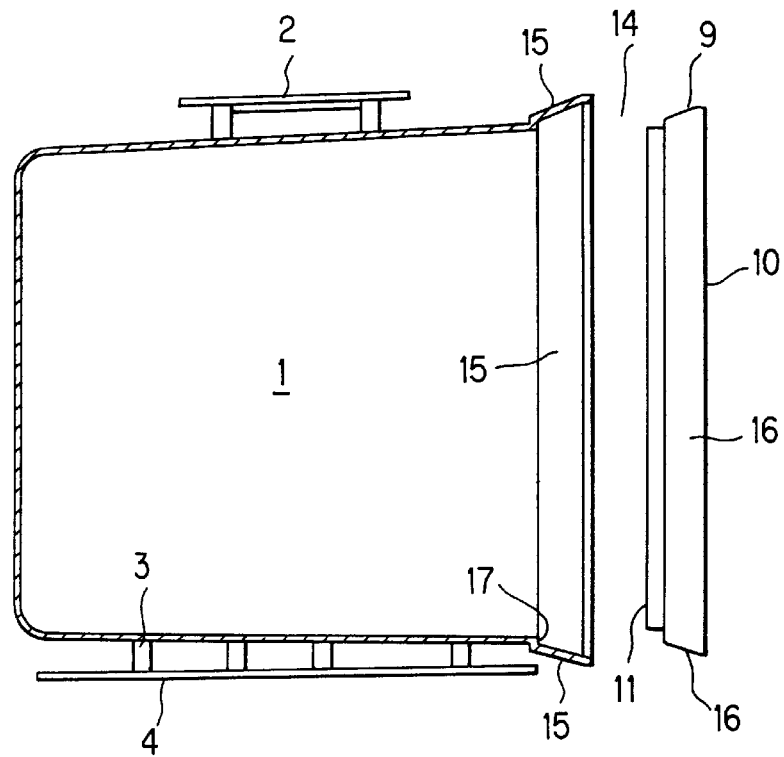
FIG. 2 is a sectional side view showing the embodiment of a storage container for precision substrates in accordance with the first principal invention.

As shown in FIGS. 1 and 2, a storage container for precision substrates in this embodiment comprises: a pod 1 for accommodating multiple (e.g., twenty five pieces) wafers (not shown) in alignment; a hollow door element 9 for hermetically closing the open front of pod 1; a guide means 14 for guiding and positioning door element 9 in the open front of the container body when door element 9 is closed; and a locking means 18 of an inner lock type for keeping the closed state when door element 9 has been closed.

Pod 1 is provided as a front-open box type molding having a transparent portion at least in part for allowing the stored wafers to be viewed, made up of synthetic resin such as polycarbonate, plycarbonate base resin alloy, etc., which are light weight and excellent in moldability. This pod 1 has high enough strength, rigidity so as not to be deformed, providing dimensional stability which assures normal operation of automatic conveyers such as AGV (Auto Guided Vehicle) etc. Attached at the center of the top of pod 1 is a robotic flange 2 by means of screw-fasteners. This robotic flange 2 is held by unillustrated ceiling conveyer so as to convey pod 1.

As shown in FIG. 2, multiple number of cylindrical attachment bosses 3 are projectively molded at predetermined distance apart. Detachably attached to these multiple attachment bosses 3 is an approximately Y-shaped bottom plate 4 by means of unillustrated fasteners, or the like. Positioning elements 5 of kinematic coupling are detachably disposed on both sides in the front and one at the rear of bottom plate 4 by means of fastener (see FIG. 1). The bosses may be formed integrally with the bottom plate. A pair of side handles 6 for manual carriage are detachably disposed on both the external side faces of pod 1.

As partially shown in FIG. 1, a pair of columns 7 opposing each other are detachably arranged or integrally formed upright on both the inner side walls of pod 1 while an unillustrated rear retainer is, as necessary, detachably fixed upright on the inner rear side of pod 1. The opposing surfaces of these pair of columns 7 and the front surface of the rear retainer have multiple support slots 8 having a U-shaped or V-shaped section arranged vertically so that each support slot 8 will support the rim of a wafer. The thus configured pair of columns 7 and the rear retainer effectively prevent vibrations of multiple number of wafers whilst supporting and aligning them in a horizontal manner with a predetermined pitch with resect to the vertical direction.

As shown in FIGS. 1 and 2, door element 9 is composed of an outer plate 10 and an inner plate 11 of an approximate box shape with its front side open, both formed of the same synthetic resin as that of pod 1. Outer plate 10 is fitted over the open face of inner plate 11 by means of fasteners. A front retainer 12 having a V-shaped supporting slots of a similar configuration to, and opposing, the rear retainer is detachably disposed and fixed to the center of inner plate 11. A sealing gasket 13 having the shape of the frame is fitted in a detachable manner to the outer periphery of inner plate 11 by means of bosses, grooves etc.

Sealing gasket 13 is formed of a thermoplastic elastomer such as polyolefines and polyesters, or fluororubber, silicone rubber etc. Alternatively, it is preferable to use a molding material which will produce lesser amounts of organic components that contaminate wafers and has a hardness of 80 degrees based on the measuring method defined by JIS K6301A.

Guide means 14, as shown in FIGS. 1 and 2, is configured of first inclined guide portions 15 formed on the upper, lower, left and right sides of the open front of pod 1 in an inclined manner so that the guide surfaces gradually go outwards from the inside, from the proximal end (the left side in FIG. 2) toward the distal end (the right side in FIG. 2) of pod 1; and second inclined guide portions 16 formed on the outer peripheral side of door element 9 in an inclined manner so that the guide surfaces gradually go outwards from the inside, from the inner plate 11 side to the outer plate 10 side of door element 9. Thus, the guide means 14 functions to guide second inclined guide portions 16 to be positioned in contact with first inclined guide portions 15 when door element 9 is closed. The proximal end of first inclined guide portions 15 functions as seal surfaces 17 against which sealing gasket 13 abuts as it is pressed and deformed when door element 9 is closed, to thereby establish a tightly sealed state.

Locking means 18 is configured, as shown in FIG. 1, for example, of multiple clamp bores 19 formed in a depressed manner in upper and lower first inclined guide portions 15 of the open front of pod 1, multiple passage openings 20 pierced, correspondingly to multiple clamp bores 19, in upper and lower second inclined guide portions 16 of door element 9, a pair of rotary cams which are axially supported by the inner walls of door element 9 and is rotated from an external access through a keyhole 21 in outer plate 10; and a pair of latch plates disposed above and below and each having a guide groove for changing actuating direction to be engaged with some play with a corresponding coupling pin on the outer periphery of each rotary cam surface. Each latch plate is formed in a rectangular shape of metal or synthetic resin having an engagement claw disposed in the distal end to be projected through passage opening 20 for engagement with the corresponding clamp bore 19.

In the above arrangement, when wafers are stored, sliced wafers are loaded first into pod 1 and aligned therein by means of the rear retainer and a pair of columns 7. Then, the open front of pod 1 is covered by door element 9 with sealing gasket 13 therebetween while front retainer 12 is abutted against the multiple wafers. In this state, locking mechanism 18 is locked by means of the door opening/closing device (opening/closing mechanism) of an unillustrated processing machine. In this step, door element 9 is guided by first and second inclined guide portions 15 and 16 on the upper, lower, left and right sides so that the door element can be positioned with a high precision with respect to the horizontal, vertical and inward directions so as to create a sealed state with no looseness or no positional displacement Here, the first inclined surface and the second inclined surface corresponding to it may be formed at one or multiple sites instead of the whole contour of the opening.

As locking means 18 is locked, each rotary cam rotates so as to cause the latch plates to project outwardly from the inner position inside door element 9 and hence the engagement claws of the latch plates project through passage openings 20 and become engaged with the clamp bores, whereby door element 9 is fitted to tightly cover the open front of pod 1 hermetically in a stable manner.

In the above arrangement, since first and second inclined guide portions 15 and 16 function as guidance, a simple configuration makes it possible to effectively prevent door element 9, which will be repeatedly used, from working loose or being fitted out of position. Accordingly, when door element 9 is fitted, no difficulties such as misalignment between clamp bore 19, passage opening 20 and the engagement claw, and locking failure of door element 9 will occur. It is also possible to very effectively prevent generation of contaminants such as particles etc. due to friction between the open front of pod 1 and the edge of door element 9.

Figure 3:
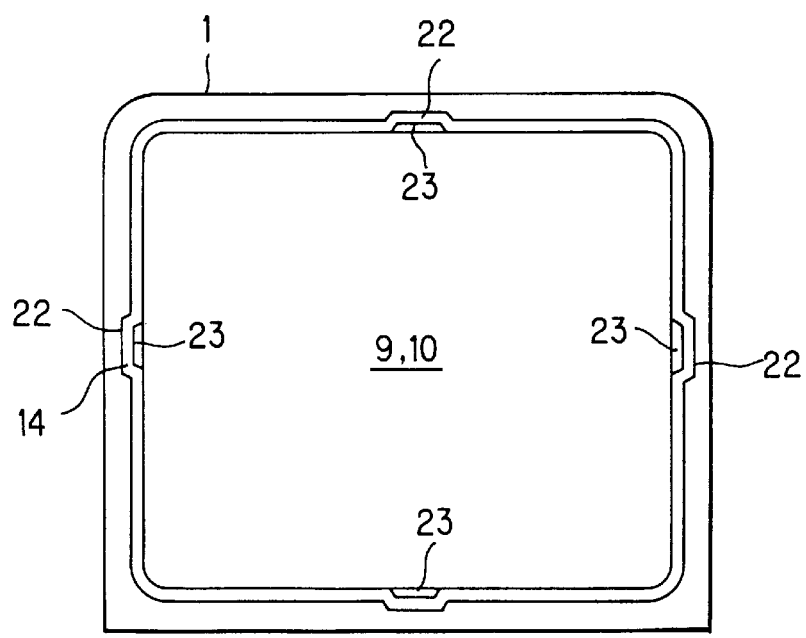
FIG. 3 is a front illustrative view showing the second embodiment of a storage container for precision substrates in accordance with the first principal invention.
Figure 4:
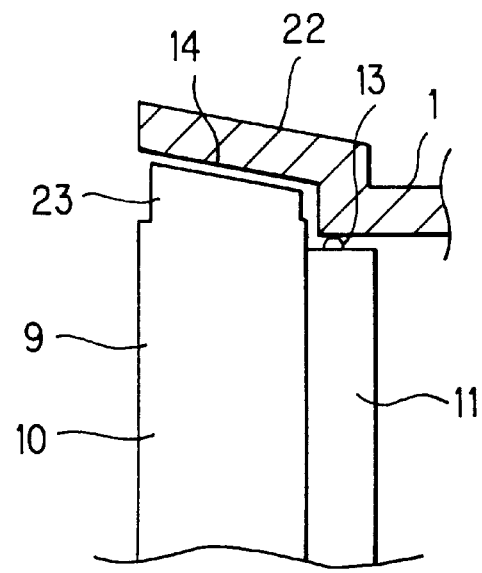
FIG. 4 is a sectional illustrative view showing the second embodiment.
Figure 5:
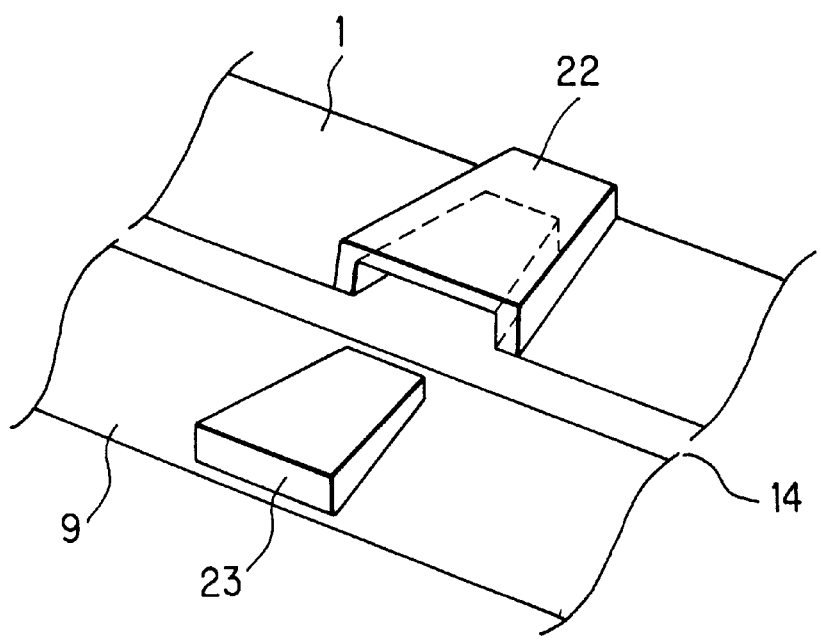
FIG. 5 is a perspective illustrative view showing the second embodiment of a storage container for precision substrates in accordance with the first principal invention.

Next, FIGS. 3 through 5 are the second embodiment of the first principal invention. In this case, guide means 14 comprises: depressed mating portions 22 which are molded in a depressed manner having an approximately U-shaped section and disposed in the center of each of the upper, lower, left and right sides of the open front of pod 1; mating ribs 23 which are molded in a projected manner in the center of each of the upper, lower, left and right peripheral sides of door element 9, so that these depressed mating portions 22 and mating ribs 23 will mate with each other when door element 9 is closed.

Depressed mating portions 22 and mating ribs 23 are molded in an approximately wedge-like trapezoidal shape so that the contact surfaces are formed in an inclined manner or their width and their depth or height gradually become depressed or projected outwardly, from the inner side (the left side in FIG. 2) toward the open front of pod 1 s (see FIGS. 3 and 4). Each mating rib 23 is set at 0.1 mm to 10 mm in height, preferably at 0.3 mm to 2.0 mm; and at 3 mm to 100 mm in width, preferably at 10 mm to 50 mm. Each depressed portion 22 is formed correspondingly to these dimensions. Other configurations are the same as those of the above first embodiment so the description will not be repeated.

The same operational effects as the first embodiment can be expected in this second embodiment. Additionally, since depressed mating portions 22 and mating ribs 23 are mated for positioning when door element 9 is closed, it is apparent that door element 9 can be tightly sealed with a further improved precision with respect to the horizontal, vertical and inward directions.

In the above embodiment, depressed mating portion 22 is provided with an approximate U-shaped cross-section, but this will not limit the invention. That is, depressed mating portion 22 may be formed with a C-shaped, rectangular or semi-circular cross section and mating rib 23 may be formed correspondingly. Depressed mating portions 22 maybe formed in the first inclined surfaces while mating ribs 23 may be formed in the second inclined surfaces in the first embodiment. Further, though a configuration where depressed mating portions 22 are formed in the open front of pod 1 and mating ribs 23 are formed on the peripheral surface of door element 9 was illustrated, it is also possible to provide mating ribs 23 in the open front of pod 1 and depressed mating portions 22 on the peripheral surface of door element 9.

Figure 6:
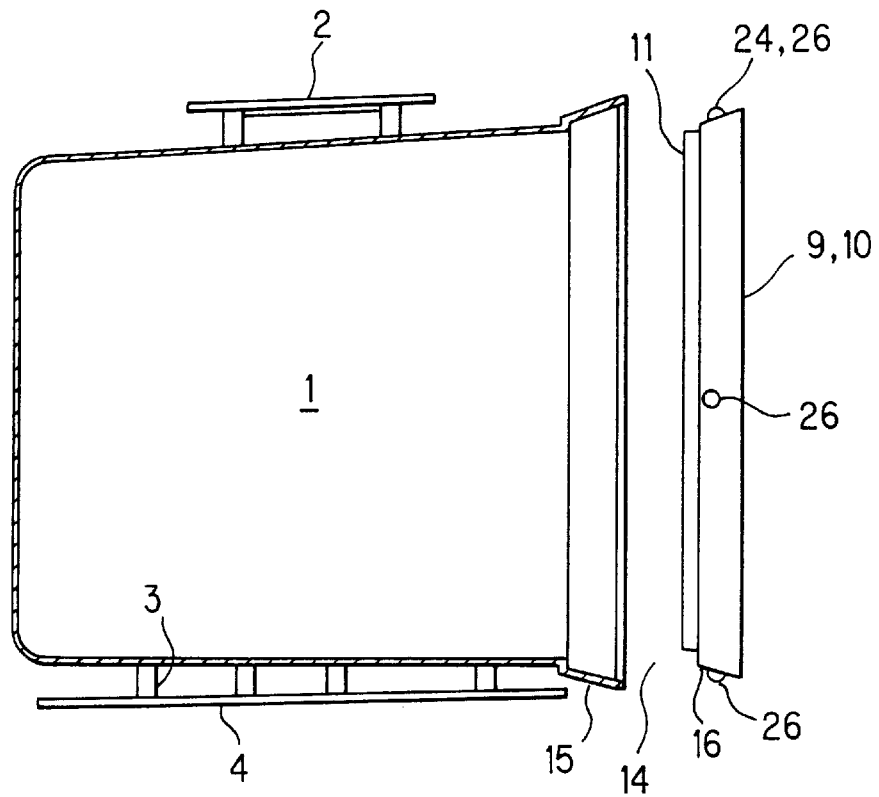
FIG. 6 is a sectional side view showing the third embodiment of a storage container for precision substrates in accordance with the first principal invention.
Figure 7:
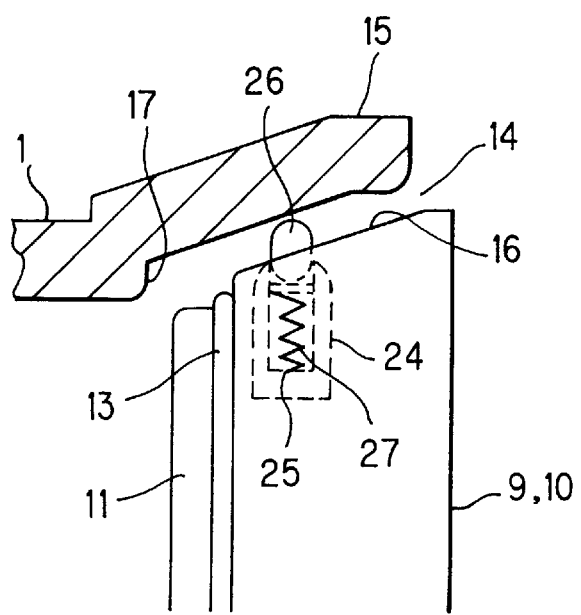
FIG. 7 is a partially enlarged sectional view of FIG. 6.

Next, FIGS. 6 and 7 show the third embodiment of the first principal invention. In this case, guide means 14 comprises: first inclined guide portions 15, second inclined guide portions 16 and multiple plunger elements 24. These multiple plunger elements 24 are embedded in the second inclined guide portions 16 of door element 9 so that they will press in contact with the first inclined guide portions 15 when door element 9 is closed.

Each plunger element 24 has a bottomed cylindrical casing 25 embedded in the interior of the peripheral part of door element 9. In each casing 25, a plunger 26 having a smoothly curved surface is resiliently supported by a coil spring 27 so that the plunger can move in and out. Each plunger 26 is supported by coil spring 27 so that it is projected from the level of the second inclined guide portion 16 by about 0.1 mm to 10 mm when door element 9 is not closed. Other configurations are the same as those of the above first embodiment so the description will not be repeated.

In the above configuration, when door element 9 is tightly fitted to the open front of pod 1 with sealing gasket 13 in between, each plunger 26 of plunger element 24 comes in contact with first inclined guide portion 15 and becomes pressed down into casing 25 as second inclined guide portion 16 is fitted whilst being guided along first inclined guide portion 15.

Also in this embodiment, the same operational effects as the above embodiments can be expected. Additionally, since plungers 26 come in contact with first inclined guide portions 15, the sliding movement is improved when the door is positioned and it is apparently possible to markedly reduce dust generation and hence effectively prevent generation of particles and other contaminants.

Figure 8:
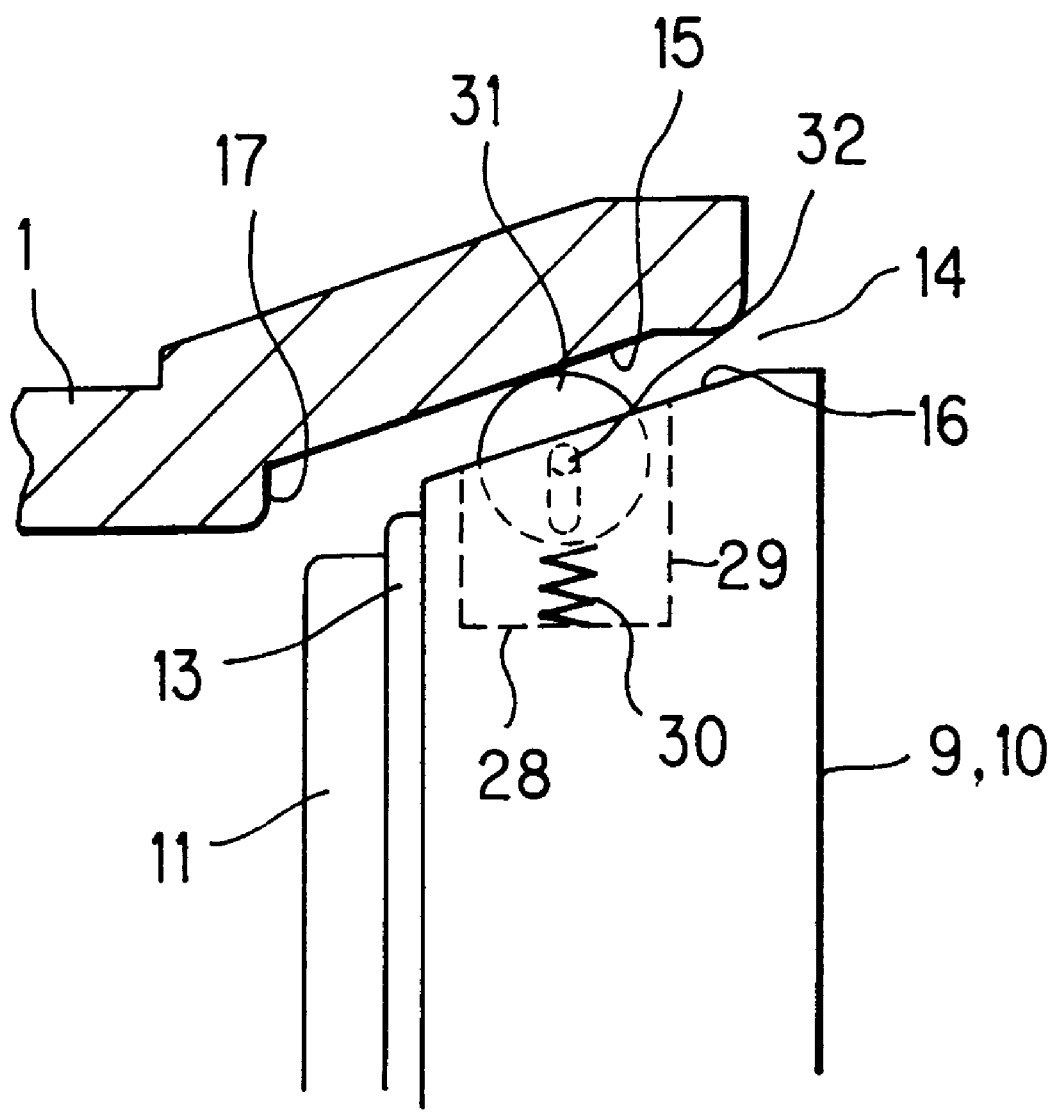
FIG. 8 is a sectional illustrative view showing the fourth embodiment of a storage container for precision substrates in accordance with the first principal invention.

Next, FIG. 8 shows the fourth embodiment of the first principal invention. In this case, guide means 14 comprises: first inclined guide portions 15, second inclined guide portions 16 and multiple roller elements 28. These multiple roller elements 28 are embedded in the second inclined guide portions 16 of door element 9 so that they will come in pressing contact with the first inclined guide portions 15 when door element 9 is closed.

Each roller element 28 has a bottomed cylindrical casing 29 embedded in the interior of the peripheral part of door element 9. A coil spring 30 is incorporated in each casing 29 with its front end abutting a rotational roller 31 supported by a guide pin 32, so that the roller can resiliently move up and down. Each rotational roller 31 is supported by coil spring 30 so that it is projected from the level of the second inclined guide portion 16 by about 0.1 mm to 10 mm when door element 9 is not closed. Other configurations are the same as those of the above third embodiment so the description will not be repeated.

In the above configuration, when door element 9 is tightly fitted to the open front of pod 1 with sealing gasket 13 in between, each rotational roller 31 of roller element 28 comes in contact with first inclined guide portion 15 and becomes pressed down into casing 29 as second inclined guide portions 16 is fitted whilst being guided along first inclined guide portions 15.

Also in this embodiment, the same operational effects as the above embodiments can be expected. Additionally, since rotational rollers 31 come in contact with first inclined guide 15, the sliding movement is improved when the door is positioned, it is apparently possible to markedly reduce frictional resistance and hence effectively prevent generation of particles and other contaminants.

Although the configurations using plungers 26 or rotational rollers 31 were illustrated in the above embodiments, the present invention is not limited to these. That is, other methods than plungers 26 and rotational rollers 31 may be used as long as it offers the same operational effects. It is also possible to use different types of springs such as a leaf spring etc., elastic elements of rubber, flexible plastic elements and the like, instead of using coil springs 27 and 30. Moreover, though configurations in which plunger elements 24 or roller elements 28 are embedded in the interior of the outer periphery of door element 9 were illustrated, they may be embedded in first inclined guide portions 15 of pod 1.

In the above embodiments, description was made of a configuration in which a pair of latch plates are provided each having a guide groove to be engaged with some play with a corresponding coupling pin on the rotary cam surface at the periphery thereof, but in place of a rotary cam it is possible to use a rotary plate without cam which has a pair of coupling pins on the surface at the outer periphery thereof to be coupled with a pair of latch plates by means of swaying pins. Alternatively, as locking means 18, it is also possible to use a locking means 18A of the second principal invention, which will be detailed later. Further, in the above embodiments, locking means 18 of an inner lock type was used, but the invention is not limited to this and outer lock type locking means may be used as appropriate. For example, similarly to the prior art, it is possible to arrange pivotable engaging pieces in the outer periphery of the open front of pod 1 and form multiple projected portions on the peripheral surface of door element 9.

Figure 9A:
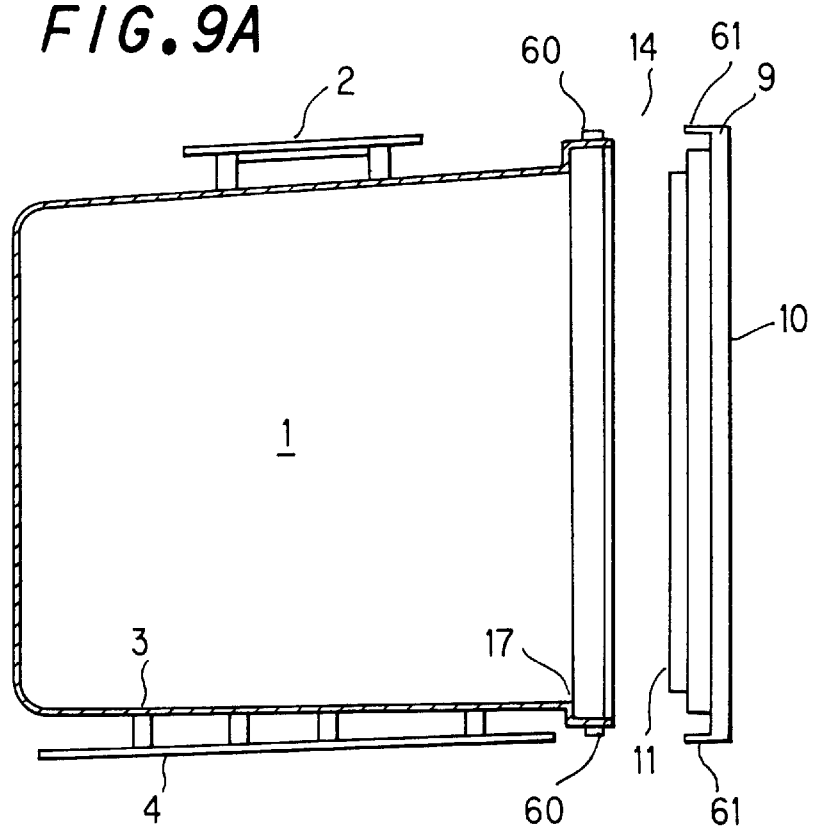
FIGS. 9A and 9B are sectional side view and front illustrative view showing a further embodiment of a storage container for precision substrates in accordance with the first principal invention, respectively.
Figure 9B:
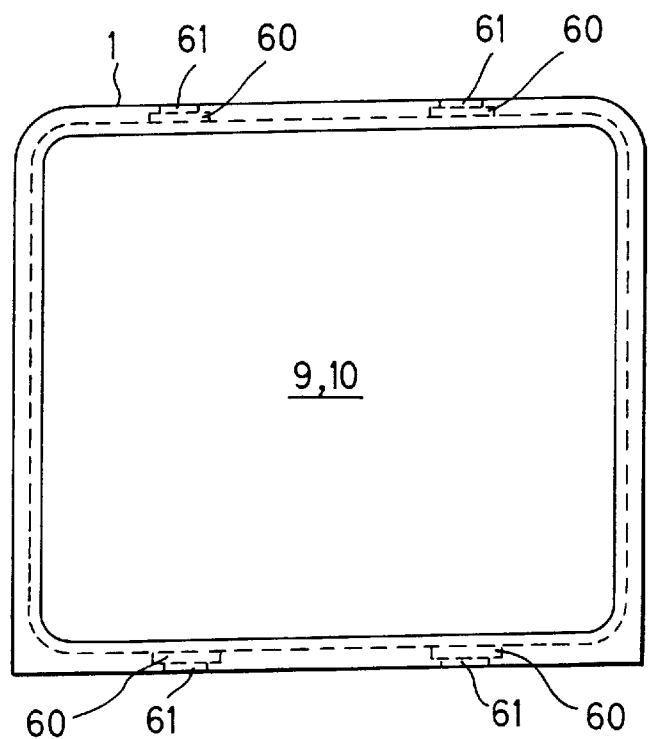
Figure 10:
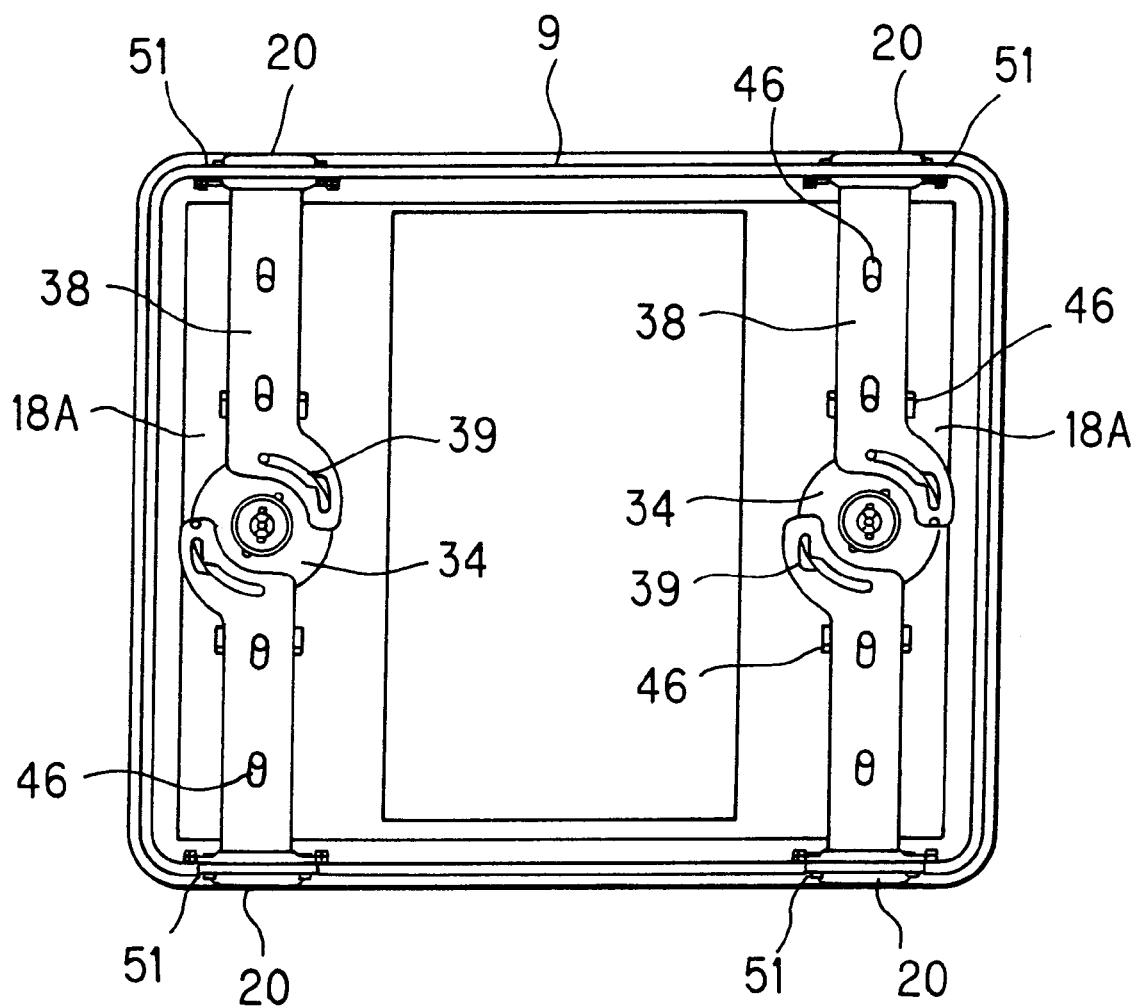
FIG. 10 is a front view showing the embodiment of a storage container for precision substrates in accordance with the second principal invention.
Figure 11:
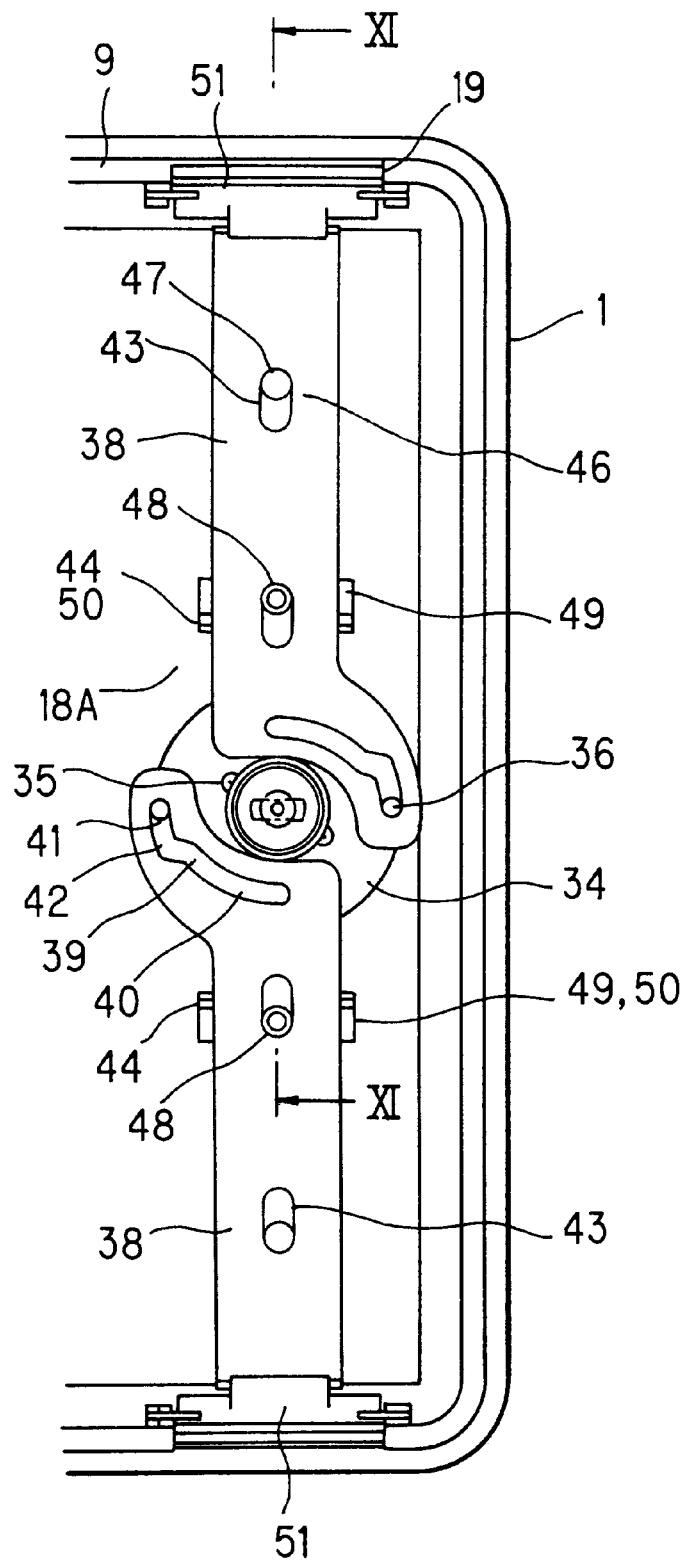
FIG. 11 is an illustrative view showing a state where the door element is open in the embodiment of a storage container for precision substrates in accordance with the second principal invention.

Moreover, it is also possible to provide, for example, a closing means of door element 9 shown in the sectional side view and the front illustration of FIGS. 9A and 9B. In this configuration, one or multiple guide portions 60 are formed on the outer wall of the opening rim having seal surface 17 therein while one or multiple plate-like projection pieces 61 are formed on outer plate 10 of door element 9 (the outer peripheral sides), at distal positions corresponding to guide portions 60, so that guide portions 60 may be engaged with plate-like projection pieces 61 when door element 9 is closed.

Next, the embodiment of the second principal invention will hereinafter be described with reference to the accompanying drawings. The second principal invention, however, will not be limited by the embodiments hereinbelow.

As shown in FIGS. 10 through 20, in the storage container for precision substrate of this embodiment, an inner lock type locking means 18A comprises: multiple clamp bores 19 formed in the upper and lower inner peripheral surface of one open face of a pod 1; multiple passage openings 20 formed on the upper and lower peripheral surface of a door element 9 so as to oppose respective clamp bores 19; a pair of rotary plates 34 which each are axially supported by the center of the inner walls of door element 9 and rotated from an external access; multiple actuation transmitting plates 38 which linearly slide inward and outward with respect to door element 9 by the rotation of corresponding rotary plates 34; a guide arrangement 46 for guiding the sliding movement of actuation transmitting plates 38; and clamping elements 51 made of synthetic resin each of which projects out from passage opening 20 and fits into clamp bore 29 when actuation transmitting plate 38 is projected and returns into passage opening 20 when actuation transmitting plate 38 is returned.

Figure 12:
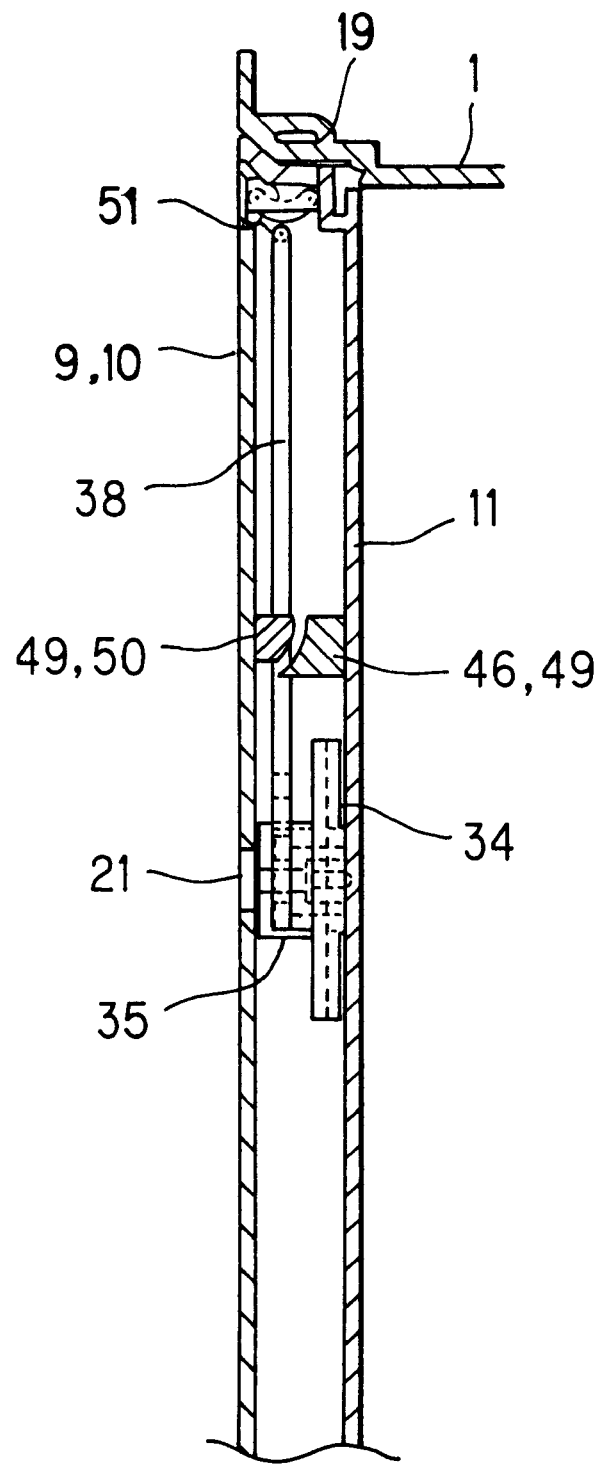
FIG. 12 is a sectional illustrative view cut along a line XI—XI in FIG. 11.
Figure 13:
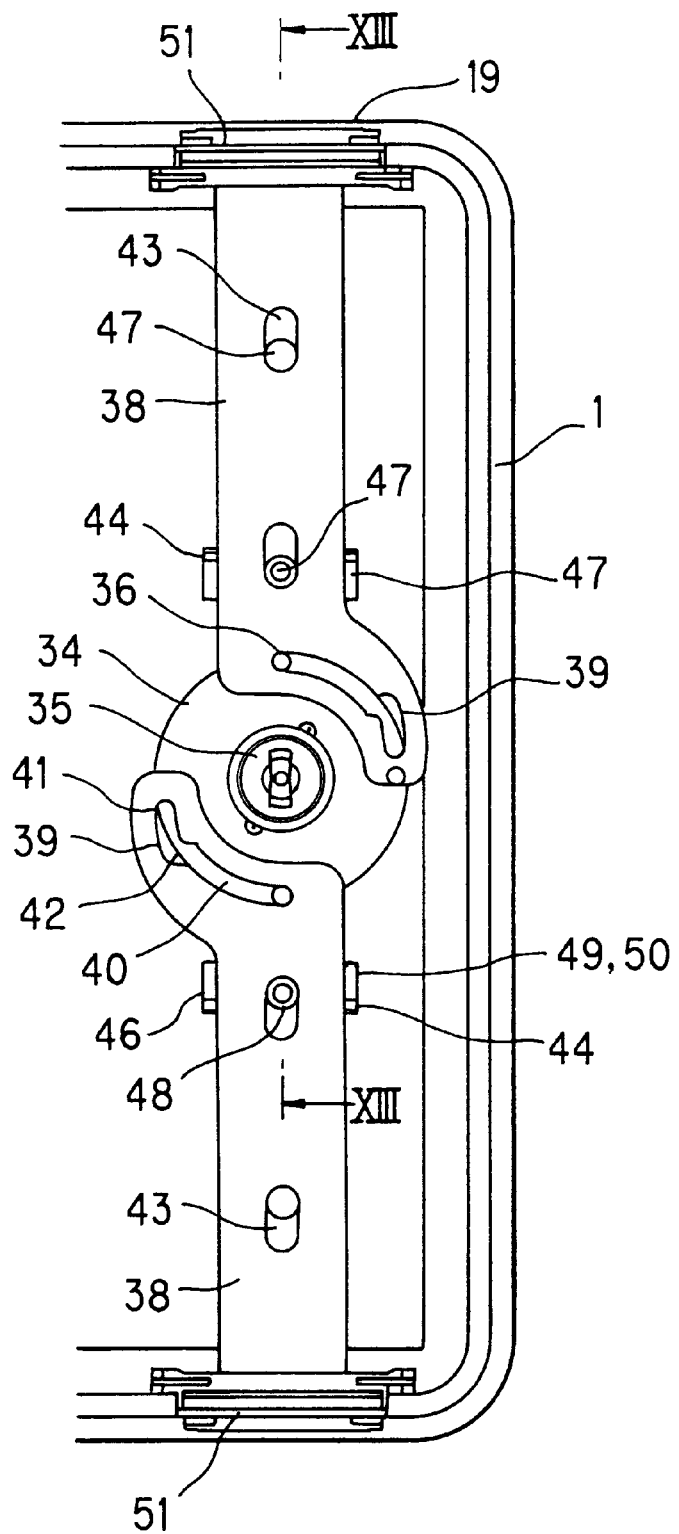
FIG. 13 is an illustrative view showing a state where the door element is closed in the embodiment of a storage container for precision substrates in accordance with the second principal invention.
Figure 14:
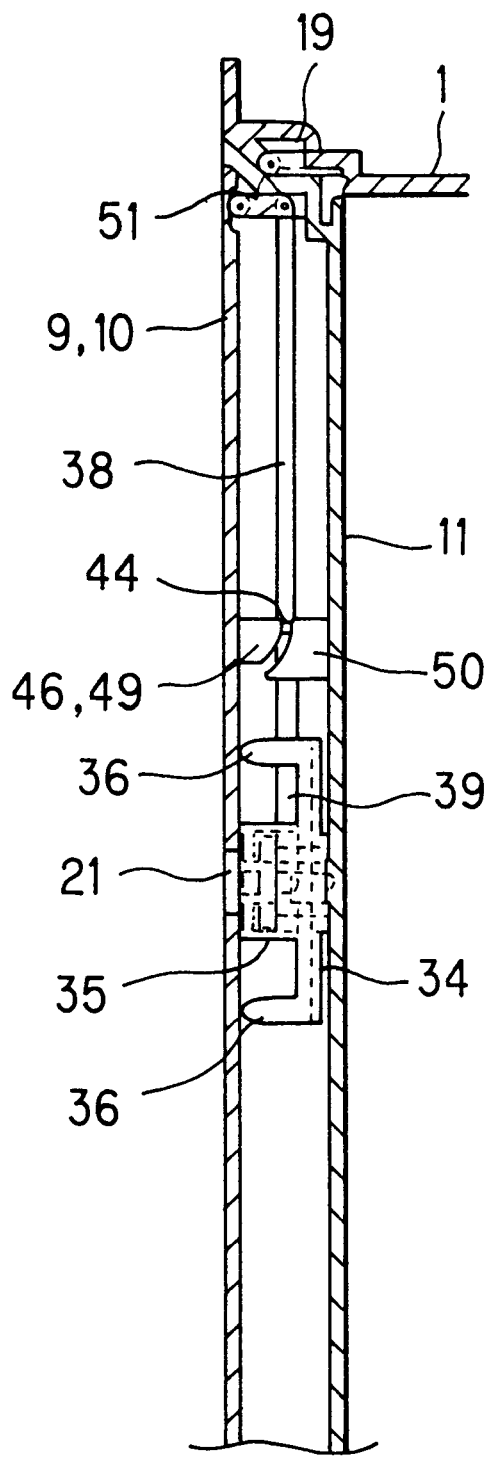
FIG. 14 is a sectional illustrative view cut along a line XIII—XIII in FIG. 13.
Figure 15A:
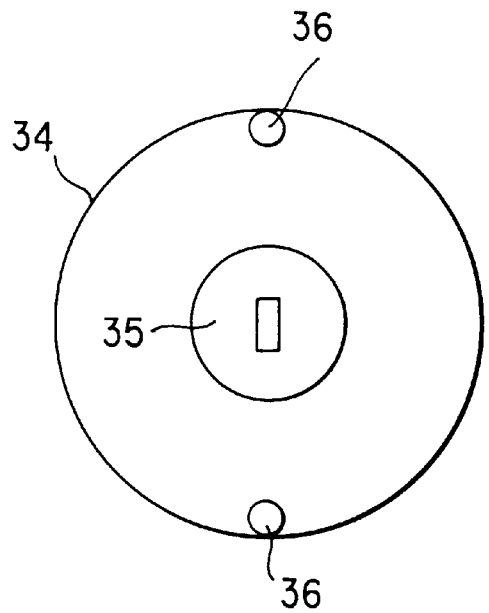
FIGS. 15A and 15B are views showing a rotary plate in the embodiment of a storage container for precision substrates in accordance with the second principal invention, being plan and sectional views, respectively.
Figure 15B:
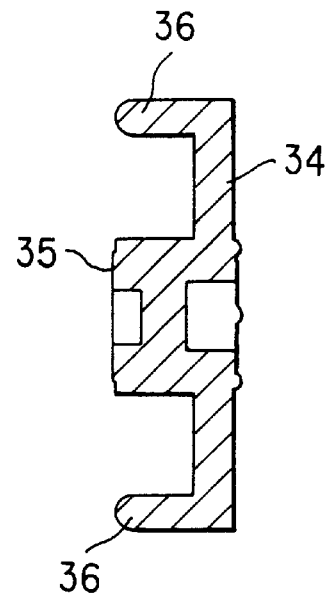
Figure 16A:
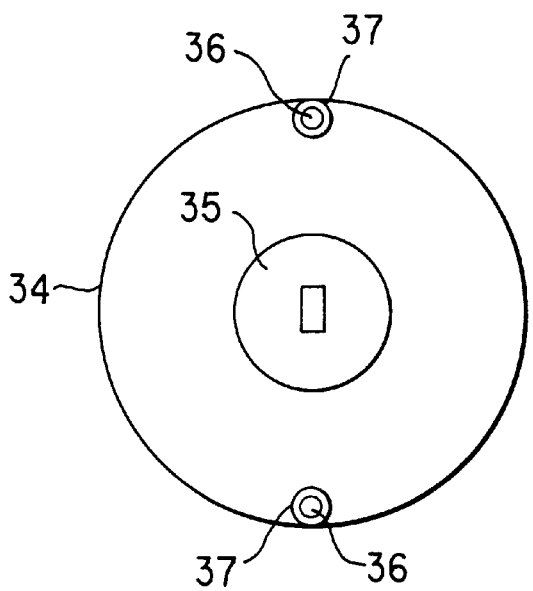
FIGS. 16A and 16B are views showing another rotary plate in the embodiment of a storage container for precision substrates in accordance with the second principal invention, being plan and sectional views, respectively.
Figure 16B:
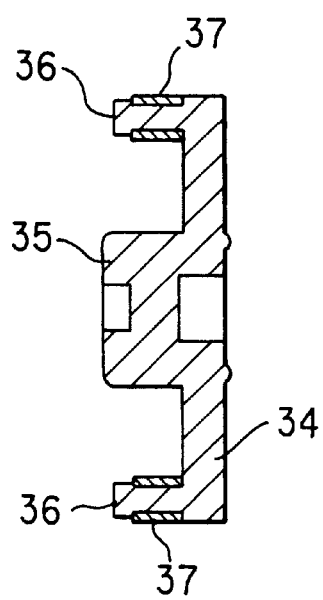
Figure 17:
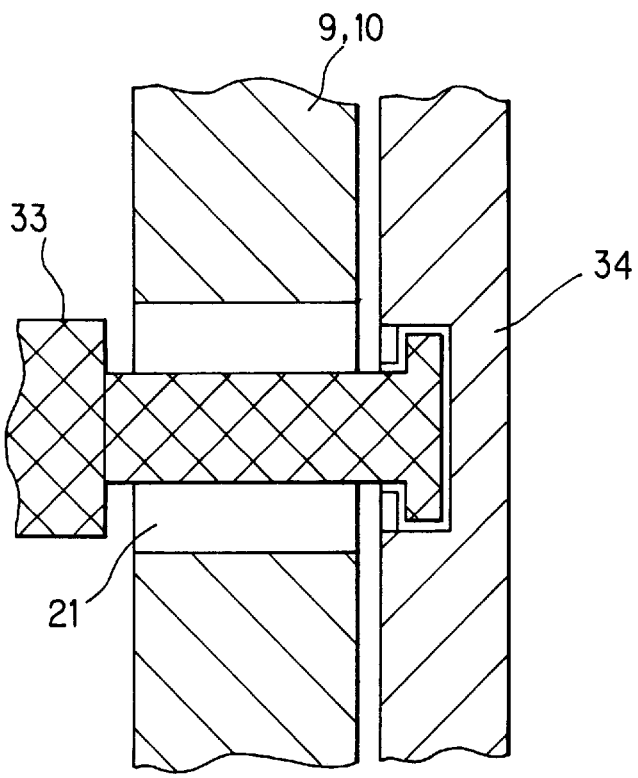
FIG. 17 is a sectional illustrative view showing a state where an opening/closing device of a processing machine is inserted into the rotary plate.
Figure 18:
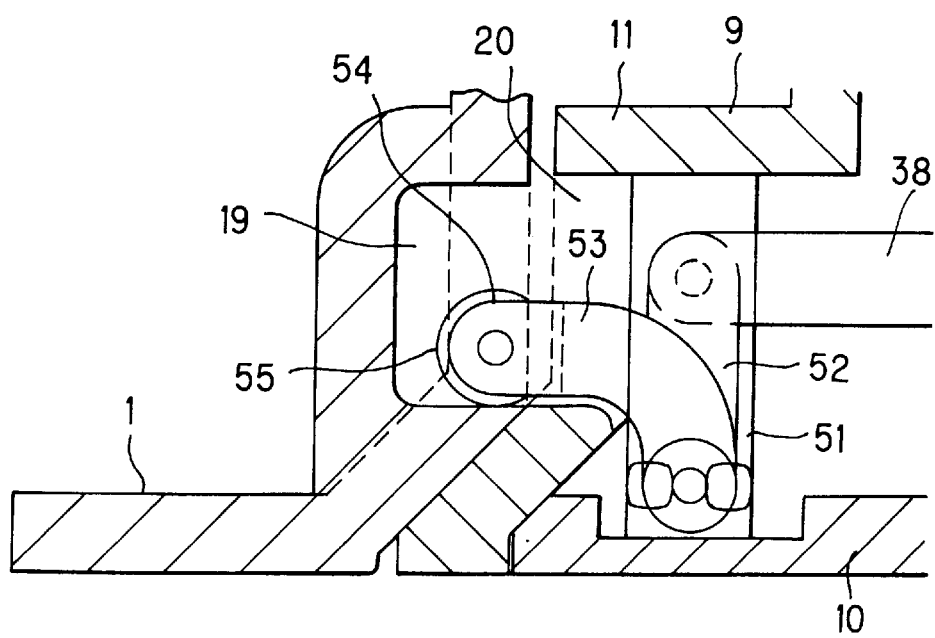
FIG. 18 is a partially enlarged sectional view showing a clamping means when it is closed in the embodiment of a storage container for precision substrates in accordance with the second principal invention.
Figure 19:
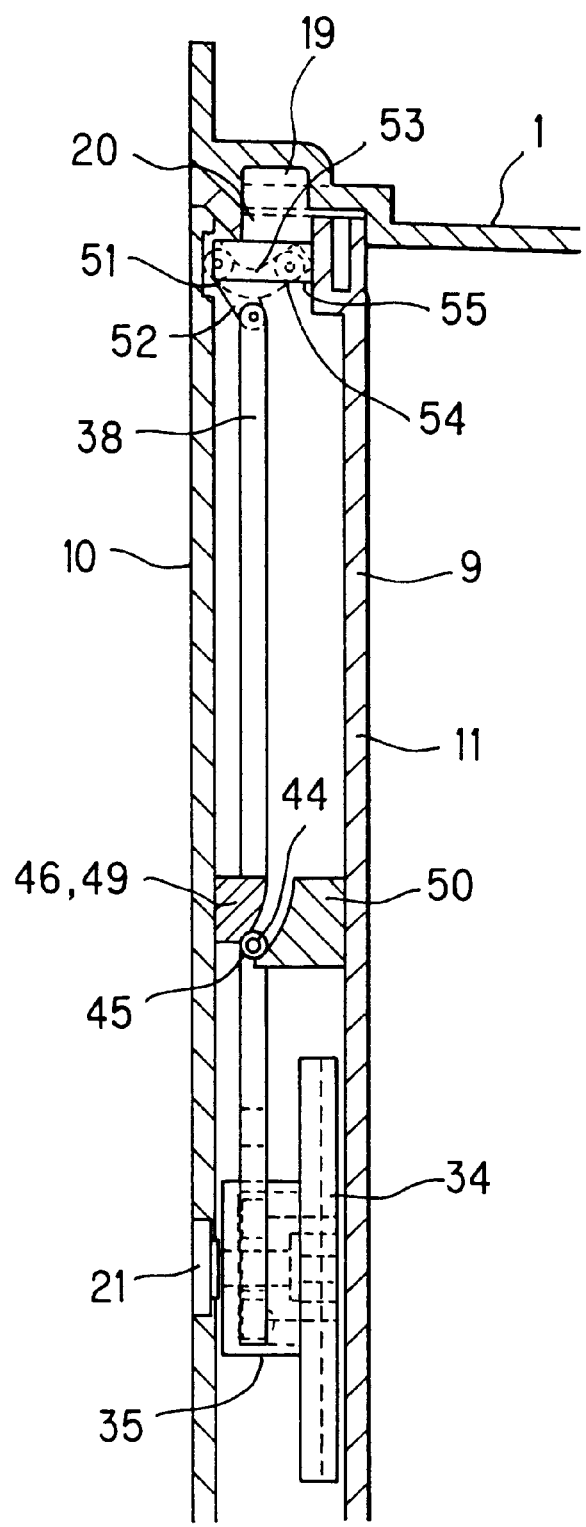
FIG. 19 is a partially enlarged sectional view showing a door element, a rotary plate, an actuation transmitting plate, a guide means and a clamping means in the embodiment of a storage container for precision substrates in accordance with the second principal invention.
Figure 20A:
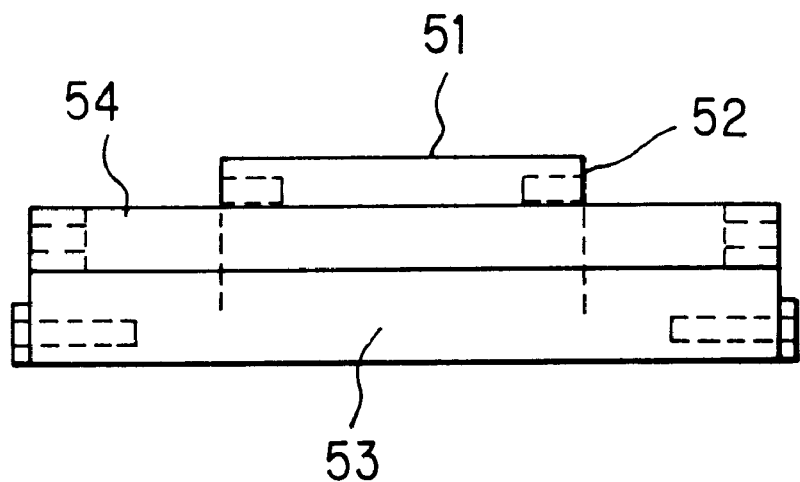
FIGS. 20A and 20B are views showing a clamping means in the embodiment of a storage container for precision substrates in accordance with the second principal invention, being plan and sectional views, respectively.
Figure 20B:
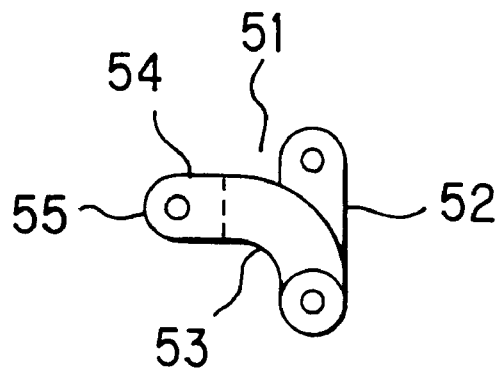

Pod 1, guide means 14 and multiple clamp bores 19 are the same as those in the embodiment of the first principal invention so that they are not described. Door element 9 comprises: as shown in FIG. 12 or FIG. 14, an outer plate 10 formed of the same synthetic resin as pod 1; and an inner plate 11 of an approximate box shape with its front side open. Outer plate 10 is fitted over the open face of inner plate 11 by means of fasteners. Bored on the left and right of outer plate 10 are keyholes 21, which will each receive an attachment 33 of the door opening/closing device of a processing machine (see FIG. 17). A front retainer 12 is detachably disposed and fixed to the center of inner plate 11. A sealing gasket 13 having the shape of the frame is fitted in a detachable manner to the outer periphery of inner plate 11 by means of bosses, grooves etc.

Each rotary plate 34, as shown in FIGS. 15A and 15B or FIGS. 16A and 16B, is formed as a disc shaped molding using polyacetal resin, PEEK resin, etc., having a bottomed cylindrical manipulatable projection 35 in the center on its outer surface. Attachment 33 passing through keyhole 21 is detachably fitted into manipulatable projection 35 (see FIG. 17). A pair of coupling pins 36 of a cylindrical shape are formed upright on the outer surface proximal to the periphery of each rotary plate 34. Each coupling pin 36 has a cylindrical rotational roller 37 as an antifriction element, fitted thereon, as required.

The connecting positions and dimensions as to the door opening/closing device and rotary plates 34 are defined by SEMI standards for each size of pod 1. For example, the standards of door element 9 for 300 mm wafers are defined based on SEMI standards E62.

Multiple actuation transmitting plates 38, as shown in FIGS. 10 through 14, are each formed of a basically, rectangular plate-like molding of polyacetal resin, PEEK resin, etc., and are arranged inside door element 9, top and bottom and on the left and right sides in a slidable manner with their center line extending along the longitudinal direction passing through the center of corresponding rotary plate 34. In each actuation transmitting plate 38, the proximal end is formed with a bent part of an approximately semicircular portion so as to extend sidewards to cover in part the peripheral portion of the outer surface of rotary plate 34. This bent portion has a bored guide slot 39 into which coupling pin 36 or rotational roller 37 fits.

Guide slot 39 is configured of a first guide slot part 40 having a curvature approximately equal to that of the locus of coupling pin 36, a second guide slot part 41 having a curvature greater than that of the locus of coupling pin 36 and an inflecting part 42 which connects between these first and second guide slot parts 40 and 41. Each first guide slot part 40 thus formed functions so that actuation transmitting plate 38 will linearly move inwards and outwards (in the vertical direction in FIG. 10) with respect to door element 9. Each second guide slot part 41 guides actuation transmitting plate 38 so that it will move linearly along a spatial path.

Each actuation transmitting plate 38 has multiple guide slots 43 of an oval shape bored around the center at intervals of a predetermined distance in its longitudinal direction. Each actuation transmitting plate 38 has a pair of guide pins 44 projected on both the left and right sides. Each guide pin 44 has a cylindrical rotational roller 45 as an antifriction element, fitted as required (see FIG. 19).

Guide arrangement 46 is configured of multiple first guides 47 which are formed upright on the inner wall of inner plate 11 and loosely fitted in corresponding guide slots 43 and a second guide 49. Each first guide 47 is formed of a cylindrical shape and has a rotational roller 48 as an antifriction element, fitted rotatably thereon, as required. Second guide 49 includes a multiple pair of opposing guides 50 which are projected from the opposing inner surfaces of outer and inner plates 10 and 11. Each pair of opposing guides 50 have opposing curved surfaces, which holds guide pin 44 or rotational roller 45 therebetween and guide actuation transmitting plate 38, as it linearly moves up and down, so as to move inward and backward (left and right in FIG. 19) with respect to door element 9, causing a three-dimensional movement.

Further, as shown in FIGS. 18 through FIGS. 20A and 20B, clamp element 51 comprises: a first arm 52 which is pivotally supported at a pin at the distal end of actuation transmitting plate 38 and a second arm 53 which is integrally formed with first arm 52 with its proximal end joined to the distal end of first arm 52. Second arm 53 is formed in an L-shape with its distal end directed approximately at right angles to the first arm 52, and has an insert-fastening 54 fitting into clamp bore 19 at its distal end. A cylindrical rotational roller 55 (antifriction element) which is in sliding contact with the inside of clamp bore 19 is supported at a pin by insert-fastening 54. Proximal end of second arm 53 is pivoted at a pin near passage opening 20 at the inner periphery of door element 9 so as to cause second arm 53, or clamp element 51, to rotate inward and outward with respect to door element 9. Other configurations are the same as those of the embodiment of the first principal invention so the description will not be repeated.

In the above arrangement, when wafers are stored, sliced wafers are loaded first into pod 1 and aligned therein by means of a pair of columns 7, and the rear retainer if it is provided as required. Then, the open front of pod 1 is covered by door element 9 with sealing gasket 13 therebetween while front retainer 12 is abutted against the multiple wafers In this state, locking mechanism 18A is locked by means of the door opening/closing device of a processing machine.

As with this, attachment 33 is inserted into manipulatable projection 35 of each rotary plate 34 so as to rotate rotary plate 34, by 90° in a clockwise direction. This movement causes each actuation transmitting plate 38 to linearly and spatially project outwards from the inner position within door element 9 whilst being guided along guide arrangement 46, so that first arm 52 deflects and hence second arm 53 pivots outwardly on its proximal end to project insert-fastening 54 out from passage opening 20. Thus rotational rollers 37 of insert-fastenings 54 fit and engage corresponding clamp bores 19 to firmly maintain the locked state of door element 9 (see FIGS. 13, 14 and 18).

In this state, insert-fastening 54 of each second arm 53 fits and engages clamp bore 19 in approximate alignment with actuation transmitting plate 38 functioning as a beam (see FIG. 14). Therefore, driving force acted on rotary plate 34 is directly and smoothly transmitted to clamp element 51. Insert-fastening 54 is projected out as it rotates without contact with passage opening 20.

Next, when the wafers which have been stored, preserved, transported etc., need to be processed, locking means 18A is unlocked by the door opening/closing device of a processing machine. That is, attachment 33 is inserted into manipulatable projection 35 of each rotary plate 34 so as to rotate rotary plate 34, by 90° in a counterclockwise direction. This movement causes each actuation transmitting plate 38 to linearly and spatially return inward from the outer position within door element 9 whilst being guided along guide arrangement 46, so that first arm 52 deflects to return and hence second arm 53 pivots inwardly to the inside of door element 9 to return insert-fastening 54 into passage opening 20. Thus, the door element 9 becomes removable (see FIGS. 11 and 12). During this movement, insert-fastening 54 returns as it rotates without contact with passage opening 20.

When door element 9 thus becomes openable, door element 9 is removed from pod 1 by vacuum suctioning or other methods. Then, multiple number of the wafers are taken out from pod 1 one by one from the lowermost one so that the wafers will be processed in the predetermined manner.

In accordance with the above configuration, since insert-fastenings 54 of second arms 53 are placed in approximate alignment with actuation transmitting plate 38 to fix door element 9, it is possible to fix door element 9 with a more stabilized and stronger force compared to the conventional configuration. Therefore, it is possible to prevent actuation transmitting plates 38 from being warped by local rises of loads from driving force and hence effectively prevent decrease in engaging force accompanied by such warp. Resultantly, it is possible to uniformly seal the open front of pod 1 effectively over a prolonged period of time. Since actuation transmitting plate 38 can be formed of a high rigidity synthetic resin such as PEEK resin etc., few or no metallic parts are needed, which leads to a prevention of the wafers from being contaminated by metal ionization during rinsing etc.

Since rotational rollers 37, 45, 48 and 55 are provided for the contact areas, frictional resistance can be markedly reduced, to thereby prevent generation of resin particles. Further, second arm 53 is pivoted in proximity to the passage opening 20, it is possible to reduce the thickness of door element 9 to as thin as possible.

Here, the components of locking means 18A of the above embodiment may be varied as appropriate. In the above embodiment, rotary plate 34 having a pair of coupling pins 36 was illustrated, but this will not limit the invention. For example, a cam mechanism, screw-thread mechanism, rack and pinion mechanism, link mechanism or the like may be used to slide actuation transmitting plate 38. Also, pins 44 are formed upright on both the left and right sides of each actuation transmitting plate 38, but it is also possible to provide cam followers on both the left and right sides of each actuation transmitting plate 38. Second arm 53 is formed in an approximate L-shape, but other bent parts such as J-shaped one may be used as long as it can produce the same operational effects.

In the above embodiment, the distal end of first arm 52 and the proximal end of second arm 53 are integrated, but it is possible to join the distal end of first arm 52 rotatably to second arm 53 as long as the same operational effects can be expected. In the above embodiment, a configuration in which insert-fastening 54 of second arm 53 has a rotational roller 55 pivoted therein was illustrated, but this will not limit the invention. For example, the distal end of rotational roller 55 is suspended by an elastic element such as a spring etc., so that it can be retracted into the interior of door element 9 when an external force acts thereon. Rotational roller 55 is arranged so as to project about 0.1 to 10 mm, preferably 0.3 to 2 mm from the peripheral surface of door element 9 so as to use rotational roller 55 as a guide when door element 9 is fitted to the open front of pod 1.

As has been described in accordance with the first through fifth features of the invention, it is possible to prevent looseness of the door element when the door element which has been removed from the opening of the container body is attached again to the opening of the container body. This contributes to prevention of malfunction of the locking of the door element and prevention of the generation of contaminants accompanied by the looseness.

In accordance with the sixth through tenth features of the invention, it is possible to seal the opening of the container body in an appropriate manner even for a large-sized one. Further, it is also possible to effectively prevent precision substrates from being contaminated.

What is claimed is:

1. A storage container for precision substrates comprising:
    a container body having an opening formed on one end face and storing precision substrates therein;
    a door element which can open and close the opening in a hermetic manner; and
    guide means for guiding and positioning the door element with respect to the opening of the container body when the door element is closed,
    wherein the guide means comprises: a depressed mating portion, at least, formed on either the underpart of the opening or the underpart of the door element periphery; and a mating projection, at least formed on the remaining underpart of either the opening or the door element periphery so as to mate with the depressed mating portion when the door element is closed, and the contact surface between the depressed mating portion and the mating projection is inclined as going outwards, from its proximal point closer to the opposed face toward the open face.

2. The storage container for precision substrates according to claim 1, wherein the guide means comprises: a first inclined guide portion, at least, formed in the underpart of the opening, gradually going outwards toward the distal end; a second inclined guide portion, at least, formed in the underpart of the periphery of the door element, gradually going outwards from the inner side to the outer side of the door element, the second inclined guide portion being put in contact with the first inclined guide portion when the door element is closed; and an antifriction element which is resiliently supported by either the first inclined guide portion or the second inclined guide portion and is pressing contact with the other of the first inclined guide portion or the second inclined guide portion, when the door element is closed.

3. The storage container for precision substrates according to claim 1, wherein the guide means comprises: one or multiple guide portions formed on the outer surfaces of the periphery of the opening; and one or multiple platelike projection pieces formed on the outer peripheral surface of the door element. the actuation transmitting element retracts.

4. A storage container for precision substrates comprising:

a container body having an opening formed on one end face and storing precision substrates therein;

a door element which is substantially hollow and can open and close one open face in a hermetic manner; and a locking means for fixing the door element in a closed state, wherein the locking means comprises: a clamp bore formed on the inner peripheral surface of the open face of the container body; a passage opening provided in the peripheral surface of the door element; a rotary element which is incorporated in the door element and rotated from an external access; an actuation transmitting element which is actuated by the rotation of the rotary element to advance outwards and retract inwards within the door element; and a clamp element which projects out through the passage opening and fits into the clamp bore when the actuation transmitting element advances and returns inside the passage opening when the actuating element retracts, wherein the clamp element comprises: a first arm attached rotatably to the distal end of the actuation transmitting element; and a second arm, of a bent shape, attached to the distal end of the first arm, and the distal end of the second arm forms an insert-fastening fitting into the clamp bore while the proximal end of the second arm is supported at a point in proximity to the passage opening inside the door element, so that the second arm can rotate inwards and outwards with respect to the door element.

5. The storage container for precision substrates according to claim 4, further comprising:

a coupling projection provided on the rotary element to couple the rotary element with the actuation transmitting element so as to cause the actuation transmitting element to make a linear movement when the rotary element rotates;

a guide means provided inside the door element for guiding the actuation transmitting element; and one or plurality of rotatable antifriction elements attached to the contact areas between the actuation transmitting element and the coupling projection and/or the contact areas between the actuation transmitting element and the guide means.

6. The storage container for precision substrates according to claim 4, wherein, in the locking means, at least the clamp element, the actuation transmitting element and the rotary element are formed of PEEK resin.

7. The storage container for precision substrates according to claim 5, wherein the antifriction element is formed of PEEK resin.

* * * * *

UNITED STATES PATENT AND TRADEMARK OFFICE
CERTIFICATE OF CORRECTION

PATENT NO. : 6,105,782
DATED : August 22, 2000
INVENTOR(S) : Yoshiaki FUJIMORI, et al.

It is certified that error appears in the above-identified patent and that said Letters Patent is hereby corrected as shown below:

Foremost page, [73] Assignee: correct to read:

-- Shin-Etsu Polymer Co., Ltd., Tokyo Japan --

Signed and Sealed this

Eighth Day of May, 2001

Attest:

NICHOLAS P. GODICI

Attesting Officer      Acting Director of the United States Patent and Trademark Office